United States Patent
Wendt et al.

(10) Patent No.: US 11,842,980 B2
(45) Date of Patent: Dec. 12, 2023

(54) METHOD FOR PRODUCING AN ELECTRONIC COMPONENT, WHEREIN A SEMICONDUCTOR CHIP IS POSITIONED AND PLACED ON A CONNECTION CARRIER, CORRESPONDING ELECTRONIC COMPONENT, AND CORRESPONDING SEMICONDUCTOR CHIP AND METHOD FOR PRODUCING A SEMICONDUCTOR CHIP

(71) Applicant: OSRAM Opto Semiconductors GmbH, Regensburg (DE)

(72) Inventors: Mathias Wendt, Hausen (DE); Simeon Katz, Regensburg (DE); Pascal Porten, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 102 days.

(21) Appl. No.: 17/284,739

(22) PCT Filed: Oct. 17, 2019

(86) PCT No.: PCT/EP2019/078233
§ 371 (c)(1),
(2) Date: Apr. 12, 2021

(87) PCT Pub. No.: WO2020/079159
PCT Pub. Date: Apr. 23, 2020

(65) Prior Publication Data
US 2021/0351156 A1 Nov. 11, 2021

(30) Foreign Application Priority Data
Oct. 18, 2018 (DE) .......................... 102018125901.8

(51) Int. Cl.
*H01L 23/00* (2006.01)

(52) U.S. Cl.
CPC .............. *H01L 24/81* (2013.01); *H01L 24/13* (2013.01); *H01L 24/16* (2013.01); *H01L 24/17* (2013.01);
(Continued)

(58) Field of Classification Search
CPC ......... H01L 24/81; H01L 24/13; H01L 24/16; H01L 24/17; H01L 2224/13017;
(Continued)

(56) References Cited

U.S. PATENT DOCUMENTS

| 4,998,665 A | 3/1991 | Hayashi |
| 5,006,920 A | 4/1991 | Schafer et al. |

(Continued)

FOREIGN PATENT DOCUMENTS

| CN | 101999168 A | 3/2011 |
| CN | 102187458 A | 9/2011 |

(Continued)

*Primary Examiner* — Douglas W Owens
(74) *Attorney, Agent, or Firm* — Slater Matsil, LLP

(57) ABSTRACT

The method of producing an electronic component (100) comprises a step A) of providing a semiconductor chip (2) having an underside (20), having a plurality of contact pins (21), and having at least one positioning pin (25) protruding from the underside. The contact pins are adapted to electrically contact the semiconductor chip. The positioning pin narrows in the direction away from the underside and protrudes further from the underside than the contact pins. The semiconductor chip is placed on the connection carrier, with the contact pins each being inserted into a contact recess and the positioning pin being inserted into the positioning recess. The contact pins are immersed in the molten solder material.

19 Claims, 6 Drawing Sheets

(52) U.S. Cl.
CPC ............... *H01L 2224/13017* (2013.01); *H01L 2224/13669* (2013.01); *H01L 2224/16237* (2013.01); *H01L 2224/1703* (2013.01); *H01L 2224/17515* (2013.01); *H01L 2224/8102* (2013.01); *H01L 2224/81031* (2013.01); *H01L 2224/81385* (2013.01); *H01L 2224/81801* (2013.01); *H01L 2924/1204* (2013.01)

(58) Field of Classification Search
CPC . H01L 2224/13669; H01L 2224/16237; H01L 2224/1703; H01L 2224/17515; H01L 2224/8102; H01L 2224/81031; H01L 2224/81385; H01L 2224/81801; H01L 2924/1204; H01L 25/167; H01L 27/14683; H01L 33/62; H01L 2224/0401; H01L 2224/05571; H01L 2224/05609; H01L 2224/05611; H01L 2224/05639; H01L 24/05; H01L 2224/10135; H01L 2224/10165; H01L 24/14; H01L 2224/056; H01L 2224/11002; H01L 2224/13013; H01L 2224/13014; H01L 2224/14133; H01L 2224/16147; H01L 2224/81005; H01L 2224/81048; H01L 2224/81141; H01L 2224/11831; H01L 2224/1601; H01L 2224/94; H01L 2924/381

See application file for complete search history.

(56) References Cited

U.S. PATENT DOCUMENTS

| | | | |
|---|---|---|---|
| 5,313,021 | A | 5/1994 | Sajja et al. |
| 7,344,959 | B1 | 3/2008 | Pogge et al. |
| 9,136,259 | B2 | 9/2015 | Pratt |
| 9,165,888 | B2 | 10/2015 | Fay et al. |
| 9,694,523 | B2 | 7/2017 | Terui et al. |
| 2001/0010743 | A1 | 8/2001 | Cayrefourcq et al. |
| 2002/0114579 | A1 | 8/2002 | Case et al. |
| 2003/0166312 | A1 | 9/2003 | Lee |
| 2006/0030075 | A1* | 2/2006 | Sugiyama ............... H01L 24/29 257/E21.503 |
| 2006/0118939 | A1 | 6/2006 | Fisher et al. |
| 2007/0042529 | A1 | 2/2007 | Vora |
| 2009/0255705 | A1 | 10/2009 | Pratt |

FOREIGN PATENT DOCUMENTS

| | | | |
|---|---|---|---|
| DE | 4423112 | A1 | 1/1996 |
| DE | 19541039 | A1 | 5/1997 |
| DE | 102018118717 | A1 | 2/2020 |
| EP | 1122567 | A1 | 8/2001 |
| FR | 3036226 | A1 | 11/2016 |
| JP | 2015088733 | A | 5/2015 |
| WO | WO-2005001933 | A2 * | 1/2005 ............ H01L 24/12 |
| WO | 2008030665 | A1 | 3/2008 |
| WO | 2009126412 | A1 | 10/2009 |

* cited by examiner

METHOD FOR PRODUCING AN ELECTRONIC COMPONENT, WHEREIN A SEMICONDUCTOR CHIP IS POSITIONED AND PLACED ON A CONNECTION CARRIER, CORRESPONDING ELECTRONIC COMPONENT, AND CORRESPONDING SEMICONDUCTOR CHIP AND METHOD FOR PRODUCING A SEMICONDUCTOR CHIP

This patent application is a national phase filing under section 371 of PCT/EP2019/078233, filed Oct. 17, 2019, which claims the priority of German patent application 102018125901.8, filed Oct. 18, 2018, each of which is incorporated herein by reference in its entirety.

TECHNICAL FIELD

A method for producing an electronic component is specified. Furthermore, an electronic component, a semiconductor chip and a method for producing a semiconductor chip are specified.

SUMMARY OF THE INVENTION

Embodiments provide a method for producing an electronic component by which a semiconductor chip is placed on a connection carrier in a positioning manner. Further embodiments provide a semiconductor chip for such a method as well as an electronic component which can be manufactured by this method. Additional embodiments provide a method for producing such a semiconductor chip.

First, a method for producing an electronic component is specified. The electronic component is preferably an optoelectronic component.

According to at least one embodiment, the method for producing an electronic component comprises a step A) in which a semiconductor chip is provided. The semiconductor chip comprises an underside, a plurality of contact pins and at least one positioning pin. The contact pins and the positioning pin protrude from the underside. The contact pins are configured to electrically contact the semiconductor chip. The positioning pin narrows in the direction away from the underside and protrudes further from the underside than the contact pins.

The semiconductor chip comprises, for example, at least four or at least 16 or at least 36 or at least 64 or at least 100 contact pins. The contact pins serve in particular for external electrical contacting of the semiconductor chip. The contact pins are preferably metallic. For example, the contact pins comprise or consist of one or more of the following materials: platinum, nickel or gold. Preferably, the contact pins are formed in one piece or in a single piece.

The semiconductor chip comprises at least one, preferably several, for example at least two or at least four, positioning pins. All specifications made in the following with respect to the one positioning pin can apply accordingly to all other positioning pins.

The positioning pin is preferably not used for contacting the semiconductor chip and is, for example, electrically insulated from the semiconductor material of the semiconductor chip. The positioning pin may be metallic. For example, the positioning pin comprises or consists of one or more of the following materials: platinum, nickel, or gold. Preferably, the positioning pin is formed as a single piece or as a single piece.

The contact pins and/or the positioning pin protrude from the underside by at least 1 μm or at least 2 μm or at least 5 μm, for example. Alternatively or additionally, the contact pins and/or the positioning pin may protrude at most 30 μm or at most 15 μm or at most 10 μm from the underside. For example, a diameter of the contact pins and/or the positioning pin measured parallel to the underside is at least 1 μm or at least 2 μm or at least 5 μm. Alternatively or additionally, the diameter of the contact pins and/or the positioning pin may be at most 30 μm or at most 15 μm or at most 10 μm.

The contact pins are, for example, cylindrical or cuboidal in shape. In the area protruding from the underside, the contact pins can also be pyramid-shaped or truncated pyramid-shaped or cone-shaped or truncated cone-shaped. Preferably, an extension of the contact pins perpendicular to the underside is greater than parallel to the underside.

The positioning pin narrows in a direction away from the underside. That is, a diameter of the positioning pin decreases in a direction away from the underside, at least in the region protruding from the underside. For example, the positioning pin narrows monotonically within the manufacturing tolerance. For example, a diameter of the positioning pin at the narrowest point is at most half as large or at most ⅓ as large or at most ¹⁄₁₀ as large as at the widest point. For example, the positioning pin in the area protruding from the underside is cone-shaped or truncated cone-shaped or pyramid-shaped or truncated pyramid-shaped.

The positioning pin protrudes further from the underside than the contact pins, in particular further than each contact pin. That is, a height of the positioning pin, measured starting from the underside and measured in a direction perpendicular away from the underside, is greater, for example at least 1.5 times as great or at least twice as great or at least three times as great as the height of the contact pins. The diameter of the positioning pin at the widest point may be at least 1.5 times as large or at least twice as large or at least three times as large as the maximum diameter of the contact pins.

The semiconductor chip is preferably an optoelectronic semiconductor chip for emission or absorption of electromagnetic radiation. In particular, the semiconductor chip comprises a semiconductor body with an active layer for generating or for absorbing electromagnetic radiation. The semiconductor body is based, for example, on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, wherein $0 \le n \le 1$, $0 \le m \le 1$, and $m+n \le 1$, respectively. Here, the semiconductor body may comprise dopants as well as additional components. For simplicity, however, only the essential constituents of the crystal lattice of the semiconductor body, i.e. Al, As, Ga, In, N or P, are specified, even if these may be partially replaced and/or supplemented by small amounts of further substances. Preferably, the semiconductor body is based on AlInGaN.

The active layer of the semiconductor body includes in particular at least one pn junction and/or at least one quantum well structure and can, for example, generate or absorb electromagnetic radiation in the blue or green or red spectral region or in the UV region during intended operation. Preferably, the semiconductor chip comprises one, in particular exactly one, connected, in particular simply connected, active layer. Alternatively, the active layer may also be segmented.

A semiconductor chip is understood here and in the following to be a separately manageable and electrically contactable element. A semiconductor chip is created in particular by separation from a wafer composite. For example, side surfaces of such a semiconductor chip then comprise traces from the separation process of the wafer composite. A semiconductor chip preferably comprises exactly one originally contiguous region of the semiconductor body grown in the wafer composite. The semiconductor body of the semiconductor chip is preferably formed contiguously. The lateral extent of the semiconductor chip, measured parallel to the main extension direction of the active layer, is, for example, at most 1% or at most 5% or at most 10% larger than the lateral extent of the active layer or the semiconductor body.

In step A), for example, the semiconductor chip still comprises a growth substrate on which the entire semiconductor body is grown.

An upper side of the semiconductor chip opposite the underside of the semiconductor chip is formed, for example, as a radiation side. For example, at least 50% of the radiation coupled out of or into the semiconductor chip is coupled out or into the semiconductor chip via the radiation side.

According to at least one embodiment, the method comprises a step B) in which a connection carrier having an upper side is provided. A plurality of contact recesses and at least one positioning recess are brought into the upper side.

The connection carrier is in particular an electronic connection carrier for electronic contacting of the semiconductor chip. For example, the connection carrier is a semiconductor carrier, such as a silicon carrier, with an integrated electronic circuit. Also, the connection carrier may be a printed circuit board or a ceramic-based carrier.

The connection carrier preferably includes a positioning recess for each positioning pin. All of the specifications made below for the one positioning recess may apply accordingly to all of the other positioning recesses.

The contact recesses and the positioning recess are brought into the upper side of the connection carrier. That is, the recesses each extend into the connection carrier from the upper side. For example, the contact recesses and/or the positioning recess each have a depth, measured perpendicular to the upper side, of at least 2 µm or at least 5 µm. Alternatively or additionally, the contact recesses and/or the positioning recess may each have a depth of at most 30 µm or at most 15 µm or at most 10 µm. The different recesses are preferably separated from each other. That is, the recesses are not connected to each other by trenches made in the upper side.

According to at least one embodiment, the contact recesses are each at least partially filled with a solder material. For example, the solder material fills the contact recesses to at least 50% or at least 60% or at least 70%. Alternatively or additionally, the solder material may fill the contact recesses to at most 90% or at most 80% in each case. The positioning recess is preferably free of a solder material.

The solder material is preferably a metal, in particular a metal alloy, more preferably a eutectic. For example, the solder material comprises gallium, indium, bismuth, silver, copper, gold, zinc, lead, or tin, or consists of any of these materials. For example, the solder material comprises or consists of galinstan (GaInSn), GaIn, BiIn, SnAgCu, SnCu, AuSn, InSn, AgIn, SnZn, AgSn, AuBi, AgBi.

Preferably, the solder materials of different contact recesses do not hang together. Thus, the solder material in one contact recess is separate from the solder material in the other contact recesses. In particular, the solder materials of the different contact recesses are electrically isolated from each other.

The diameters of the contact recesses are preferably selected so that one contact pin fits into each. That is, the diameters of the contact recesses are larger than the diameters of the contact pins. The diameter of a recess is measured parallel to the upper side or parallel to a main extension plane of the connection carrier. For example, the contact recesses comprise a diameter at least 10% or at least 20% or at least 50% larger than the contact pins. Alternatively or additionally, the diameter of the contact recesses may be at most 100% or at most 75% or at most 50% larger than the diameter of the contact pins. The contact recesses are, for example, cylindrical or cuboid recesses in the connection carrier.

A diameter of the positioning recess is preferably selected so that at least a portion of the positioning pin facing away from the underside fits into the positioning recess. Preferably, the entire portion of the positioning pin protruding from the underside fits completely into the positioning recess. The positioning recess is, for example, a cylindrical or cuboidal or cone-shaped or truncated cone-shaped or pyramid-shaped or truncated pyramid-shaped recess in the connection carrier.

According to at least one embodiment, the method comprises a step C) in which the solder material in the contact recesses is heated to a joining temperature at which the solder material melts at least partially, preferably completely. The joining temperature is thus above the solidus temperature, preferably above the liquidus temperature, of the solder material. For example, the joining temperature is between 100° C. and 400° C., inclusive.

According to at least one embodiment, the method comprises a step D) in which the semiconductor chip is placed on the connection carrier, wherein the contact pins are each inserted into a contact recess and the positioning pin is inserted into the positioning recess. The contact pins are immersed in the molten solder material. Each contact pin is preferably assigned uniquely to a contact recess.

The arrangement of the contact recesses and the positioning recess in the upper side of the connection carrier is thus adapted in particular to the arrangement of the contact pins and the positioning pin on the underside of the semiconductor chip, so that when the semiconductor chip is placed on the connection carrier each contact pin can be assigned to a contact recess and the positioning pin to the positioning recess. In other words, the contact recesses and the positioning recess are arranged in such a way that, when the semiconductor chip is mounted, each contact pin can be inserted into a specifically assigned contact recess and the positioning pin can be inserted into the positioning recess. Preferably, when there are multiple positioning pins and multiple positioning recesses, each positioning pin can be inserted into a dedicated positioning recess.

For example, the contact pins are arranged on the underside of the semiconductor chip at regular intervals, for example, on the grid points of a rectangular grid or a hexagonal grid. The positioning pin or pins are arranged, for example, on the edge of the underside. Accordingly, the contact recesses in the connection carrier are then arranged with the same spacing and in the same regular pattern. In particular, the connection carrier comprises at least as many contact recesses or positioning recesses as the semiconductor chip comprises contact pins or positioning pins.

During placement, the positioning pin projecting further from the underside first penetrates the positioning recess. The narrowing shape of the positioning pin automatically aligns the semiconductor chip with the connection carrier. The contact pins then penetrate into the associated contact recesses. Preferably, each contact pin is immersed in molten solder material and comes into direct mechanical contact with the solder material.

When the contact pins are immersed in the solder material, the solder material is applied to an area of the contact pins facing the connection carrier. An area of the contact pins facing away from the connection carrier can remain free of the solder material.

After the semiconductor chip has been applied, the solder material can be cooled so that it hardens. Alternatively, it is also possible that isothermal solidification of the solder material takes place by a reaction with the contact pins.

Preferably, steps A) to D) are carried out in the order indicated and in succession.

In at least one embodiment, the method for producing an electronic device comprises a step A) of providing a semiconductor chip having an underside, having a plurality of contact pins and having at least one positioning pin. The contact pins and the positioning pin protrude from the underside. The contact pins are configured to electrically contact the semiconductor chip. The positioning pin narrows in a direction away from the underside. The positioning pin protrudes further from the underside than the contact pins. In a step B), a connection carrier having an upper side in which a plurality of contact recesses and at least one positioning recess are brought in is provided. The contact recesses are each at least partially filled with a solder material. In a step C), the solder material in the contact recesses is heated to a joining temperature at which the solder material at least partially melts. In a step D), the semiconductor chip is placed on the connection carrier, wherein the contact pins are each inserted into a contact recess and the positioning pin is inserted into the positioning recess. The contact pins are thereby immersed in the molten solder material.

Embodiments are based in particular on the realization that in the case of highly pixelated, optoelectronic semiconductor chips, for example with a pixel size of approximately 10 µm and an overall dimension of approximately 20 mm×20 mm, these semiconductor chips must be set with an alignment tolerance of at most 10 µm. Boundary conditions, such as the bending of the semiconductor chip and the reliability and mechanical stability of the electrical contacts, should also be taken into account.

With the present method, the semiconductor chip can be reliably applied even with very small distances between the contact pins. The positioning pin and positioning recess ensure correct alignment of the semiconductor chip already during placement and before the contact pins are inserted into the associated contact recesses. Complex planarization, as in hybrid direct bonding, can be avoided. Within the alignment tolerance, which is given by half the difference between the diameter of the contact recesses and the diameter of the contact pins, stable fixation can be achieved. A particularly high alignment tolerance can be achieved with very thin contact pins, i.e. with a small diameter. The height of the entire component can be varied via the height of the contact pins.

According to at least one embodiment, the positioning recess comprises a larger diameter than the positioning pin. In particular, the diameter of the positioning recess is larger than the diameter of the positioning pin at the narrowest point, preferably larger than at the widest point. For example, the positioning recess comprises a diameter at least 10% or at least 20% or at least 50% larger than the positioning pin at the widest point. Particularly preferably, the diameter of the positioning recess is at most twice as large or 1.75 times as large or at most 1.5 times as large as the diameter of the positioning pin at the widest point.

According to at least one embodiment, a depth of the positioning recess is greater than the depths of the contact recesses, in particular than the depth of each contact recess. For example, the depth of the positioning recess is at least 1.5 times as large or at least twice as large or at least three times as large as the depths of the contact recesses. Depths are measured perpendicular to the upper side of the connection carrier.

According to at least one embodiment, the solder material and the material of the contact pins are selected such that in step D) and at the joining temperature, the solder material and the contact pins are joined to one another by isothermal solidification. In step D), therefore, a reaction takes place between the solder material and the material of the contact pins, as a result of which the solder material solidifies isothermally. In this case, the joining temperature is selected so that it is below the melting temperature of the joint formed during isothermal solidification.

For example, the solder material may be AuSn. The contact pins can be platinum. The melting temperature of the solder material is then around 280° C. AuSn reacts with platinum, resulting in isothermal solidification. The melting temperature of the resulting compound is over 400° C. In the case of tin- or indium-based solder materials, Ni- or Au-based contact pins are also suitable for achieving isothermal solidification.

Advantageously, when applying the semiconductor chip to the connection carrier, the joining temperature can be freely selected in the range between the melting temperature of the solder material and the melting temperature of the joint formed during isothermal solidification, so that tensions or relaxations can be set in the semiconductor layer sequence of the semiconductor chip. In particular, if the semiconductor layer sequence of the semiconductor chip is arranged on a growth substrate, the semiconductor layer sequence can be strongly strained. This tension can be counteracted by placing on the connection carrier and by setting an appropriate joining temperature. Afterwards, the growth substrate can be detached, for example.

According to at least one embodiment, the method electrically connects the semiconductor chip on the connection carrier. In other words, the contact pins are electrically conductively connected to corresponding contact elements of the connection carrier. The electrically conductive connection is thereby mediated by the solder material. After step D), the semiconductor chip can then be energized via the connection carrier, for example, and operated as intended. In the intended operation, the positioning pin is not used, for example, for electrical contact between the semiconductor chip and the connection carrier. For example, no current flows through the positioning pin during intended operation.

According to at least one embodiment, the semiconductor chip is a pixelated optoelectronic semiconductor chip. That is, the semiconductor chip comprises a plurality of fields, English pixels, which can preferably be controlled individually and independently of each other and can thus emit or absorb electromagnetic radiation individually and independently of each other.

The active layer of the semiconductor body can be formed contiguously and extend over all pixels. Alternatively, however, the active layer may be divided into individual segments, wherein each segment is uniquely assigned to a pixel.

Each pixel may, for example, comprise a lateral extent, measured parallel to the underside of the semiconductor chip, of at most 250 µm or at most 150 µm or at most 50 µm or at most 10 µm. Alternatively or additionally, the pixels may each comprise a lateral extent of at least 2 µm or at least 5 µm. For example, the semiconductor chip comprises at least four or at least 16 or at least 36 or at least 64 or at least 100 such pixels.

According to at least one embodiment, a pixel or field is assigned to each contact pin, in particular uniquely assigned. However, several pixels can also be assigned to a contact pin. By supplying charge carriers via the contact pin, the assigned pixel or pixels can thus be operated, preferably exclusively the assigned pixel or pixels.

According to at least one embodiment, the connection carrier comprises a plurality of electronic switches. The electronic switches may be integrated into the connection carrier. For example, the switches are transistors. In particular, the connection carrier is a Si carrier with integrated circuitry.

According to at least one embodiment, a switch is assigned to each contact recess, in particular uniquely assigned. After application of the semiconductor chip, each contact pin is preferably electrically conductively connected to a switch. Via the switches, the individual pixels of the pixelated semiconductor chip can be controlled and operated individually and independently of one another.

According to at least one embodiment, in step D) the contact pins are immersed in the molten solder material to such an extent that in each contact recess the volume of the displaced solder material is at least 10% or at least 15% or at least 20% or at least 30% or at least 50% or at least 70% of the total volume of the solder material in the contact recess. Alternatively or additionally, the volume of the displaced solder material is in each case at most 90% or at most 80% or at most 50% or at most 20% of the total volume of the solder material. In particular, therefore, the amount of solder material, the shape of the contact recess, and the shape of the contact pin are each selected such that a large amount of molten solder material comes into contact with the contact pin, which promotes isothermal solidification.

According to at least one embodiment, the upper side of the connection carrier in the region outside the contact recesses and the positioning recess is less wettable with the molten solder material than the contact pins. Preferably, the areas of the upper side outside the contact recesses and the positioning recess are not wettable with the molten solder material. When applying the semiconductor chip, this reduces the risk of the solder materials of adjacent contact recesses bonding to each other and thus causing a short circuit.

According to at least one embodiment, the distance between each two adjacent contact pins is at least 1 µm or at least 2 µm or at least 5 µm. Alternatively or additionally, the distance between each two adjacent contact pins may be at most 50 µm or at most 20 µm or at most 10 µm. The distances are defined here, for example, as the distances between the centers of gravity of the contact pins. The distances between centers of gravity or centers of the contact recesses can be selected accordingly. The distance between the positioning pin and the nearest contact pin can also be within the ranges mentioned.

According to at least one embodiment, a growth substrate of the semiconductor chip is detached before step D). Thus, for example, in step A) the semiconductor chip still comprises a growth substrate, for example a sapphire substrate, on which the semiconductor layer sequence has been epitaxially grown. Alternatively, however, it is also conceivable that the growth substrate of the semiconductor chip is not detached until after it has been placed and fixed on the connection carrier.

Next, a semiconductor chip is specified. For example, the semiconductor chip may be used as a semiconductor chip in the method described previously. Therefore, all features disclosed in connection with the previously described method are also disclosed for the semiconductor chip, and vice versa.

According to at least one embodiment, the semiconductor chip comprises a semiconductor body, an underside, a plurality of contact pins, and at least one positioning pin. The contact pins and the positioning pin each protrude from the underside. The contact pins are configured to electrically contact the semiconductor body. The positioning pin narrows in the direction away from the underside. The positioning pin protrudes further from the underside than the contact pins.

The semiconductor chip can be a so-called volume emitter, in particular a flip chip. In this case, the semiconductor chip preferably still comprises the growth substrate, which is formed of sapphire, for example. Preferably, however, the semiconductor chip is a surface emitter, in particular a so-called thin-film chip, in which the growth substrate is detached.

According to at least one embodiment, the positioning pin is electrically isolated from the semiconductor body. For example, an electrically insulating layer is formed between the positioning pin and the semiconductor body. For example, the electrically insulating layer may comprise or consist of silicon oxide or silicon nitride or aluminum oxide.

Next, an electronic component is specified. The electronic component includes, for example, a semiconductor chip as previously described. Further, the electronic component may be manufactured by the method described previously. Thus, all features disclosed in connection with the semiconductor chip and the previously described method are also disclosed for the electronic component, and vice versa.

According to at least one embodiment, the electronic component comprises a semiconductor chip according to at least one of the previously described embodiments. Further, the electronic component comprises a connection carrier having an upper side in which a plurality of contact recesses and at least one positioning recess are brought in. The contact recesses are each at least partially filled with a solder material. The solder materials of different contact recesses do not hang together. The semiconductor chip is mounted on the upper side of the connection carrier with the underside first. Each contact pin is assigned a contact recess and the positioning pin is assigned the positioning recess. The contact pins each protrude into a contact recess. The positioning pin protrudes into the positioning recess. The contact pins are each bonded cohesive to the solder material of the contact recesses.

Preferably, however, the contact pins are not arranged completely in the contact recesses, but are arranged in areas outside the contact recesses. That is, in a direction away from the upper side of the connection carrier and toward the underside of the semiconductor chip, the contact pins project beyond the upper side of the connection carrier, for example by at least 500 nm or at least 1 µm.

For example, lower regions of the contact pins, which are arranged within the recesses, are wetted with the solder material. Upper regions of the contact pins, which face away from the connection carrier and are located outside the recesses, for example, are preferably free of the solder material.

According to at least one embodiment, the semiconductor chip is electrically connected to the connection carrier via the contact pins and via the solder material.

Next, a method for producing a semiconductor chip is specified. The method is particularly suitable for producing a semiconductor chip as described above. All features disclosed in connection with the semiconductor chip described above are therefore also disclosed for the method, and vice versa.

According to at least one embodiment, the method for producing a semiconductor chip comprises a step A) in which a base body having a semiconductor body and an underside is provided. A plurality of contact pins and at least one positioning pin are arranged on the semiconductor body, each of which protrudes from the underside. The contact pins are configured to make electrical contact with the semiconductor body, for example electrically conductively connected thereto. The positioning pin protrudes further from the underside than the contact pins. A diameter of the positioning pin is substantially constant over the entire height of the positioning pin. In a step B), a shaped body is formed on the semiconductor body in the region adjacent to the positioning pin, wherein the shaped body laterally encompasses the positioning pin. In a step C), an etching process is performed, wherein an etchant is applied to the sides of the shaped body and the positioning pin facing away from the semiconductor body. The etchant attacks the shaped body and the positioning pin, and comprises a higher etching rate for the shaped body than for the positioning pin. The etching process is carried out until the shape of the positioning pin has changed such that the positioning pin narrows in the direction away from the underside.

In particular, the fact that a diameter of the positioning pin is substantially constant over the entire height of the positioning pin means that the positioning pin comprises a constant diameter in the region protruding from the underside within the manufacturing tolerance. In step A), for example, the positioning pin has the shape of a cuboid or a cylinder. The height of the positioning pin is the extension perpendicular to the underside.

For example, the shaped body may comprise or consist of a plastic, for example benzocyclobutene, or a photoresist, or a silicone or an epoxy. Preferably, the shaped body reshapes the positioning pin such that the shaped body is directly adjacent to and reshapes the positioning pin. Similarly, the shaped body may laterally encompass the contact pins.

A wet chemical etchant, such as KOH or a mixture of $H_2O_2$ and $H_2SO_4$, is particularly suitable as an etchant in step C). However, dry chemical etching processes are also conceivable.

The etching rate of the etchant for the shaped body is, for example, at least 1.5 times as high or at least twice as high or at least three times as high as for the positioning pin. For example, the etching rate for the shaped body is additionally at most 10 times or at most 5 times as high as for the positioning pin. The consequence of this is that the etchant etches away the shaped body faster than the positioning pin. In the area of the etched away shaped body, the positioning pin then protrudes from the shaped body. As a result, the etchant also attacks the positioning pin laterally. As a result, the shape of the positioning pin develops into a shape with a diameter that decreases in the direction away from the underside.

After step C), the base body can be separated into a plurality of semiconductor chips, for example. That is, the base body is a wafer composite during steps A) to C), for example. Alternatively, however, it is also possible that the base body with the contact pins and the positioning pins formed in step C) already forms the semiconductor chip without being further singulated.

According to at least one embodiment, the etching process in step C) is carried out until the shaped body is completely removed. For example, the underside of the base body is not attacked by the etchant, so that the etching process automatically stops at the underside.

According to at least one embodiment, the contact pins and the positioning pin are electroplated on the semiconductor body before step A).

According to at least one embodiment, the contact pins and a first portion of the positioning pin are fabricated together using a first electroplating process. Heights of the first section of the positioning pin and the contact pins, measured perpendicular to the underside, are then equal within the manufacturing tolerance after the first electroplating process.

According to at least one embodiment, after the first electroplating process, the positioning pin is finished in a second electroplating process. In the second electroplating process, preferably only the height of the positioning pin is increased, but not the contact pins. That is, the second electroplating process is not applied to the contact pins.

BRIEF DESCRIPTION OF THE DRAWINGS

In the following, a method for producing an electronic component described herein, a semiconductor chip described herein, an electronic component described herein, and a method for producing a semiconductor chip described herein are explained in more detail with reference to drawings based on exemplary embodiments. Identical reference signs thereby specify identical elements in the individual figures. However, no references to scale are shown, rather individual elements may be shown exaggeratedly large for better understanding.

DETAILED DESCRIPTION OF ILLUSTRATIVE EMBODIMENTS

Figure 1A:
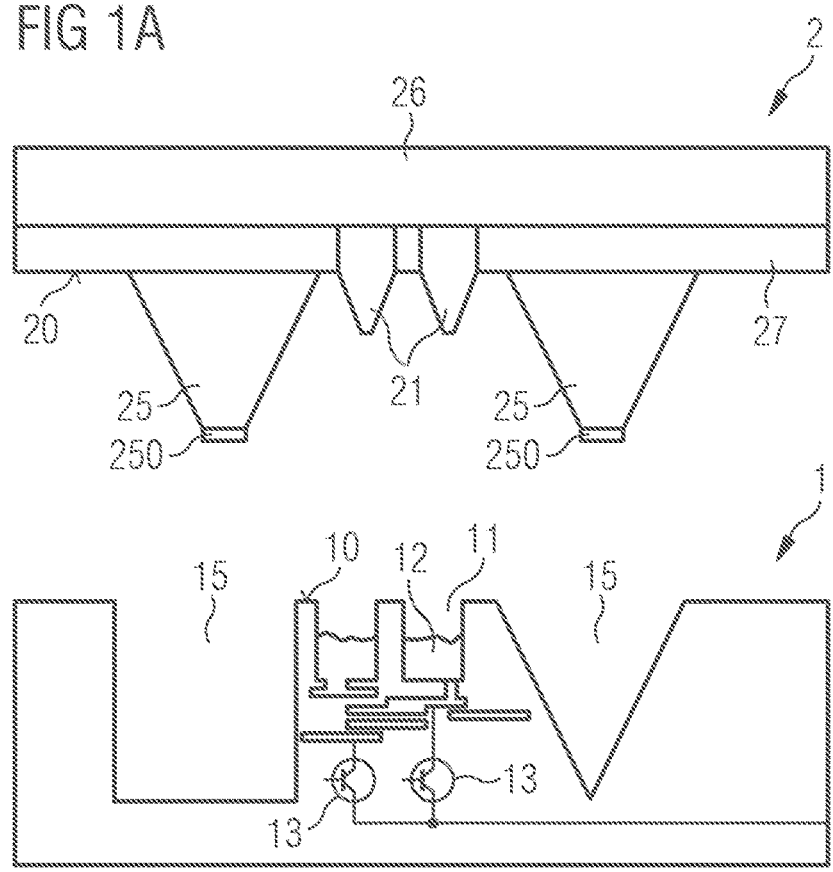
FIGS. 1A-1C shows various positions in an exemplary embodiment of the method for producing an electronic component, and an exemplary embodiment of an electronic component and an exemplary embodiment of a semiconductor chip.

In FIG. 1A, a first position in an exemplary embodiment of the method for producing an electronic component is shown. At the same time, FIG. 1A shows an exemplary embodiment of the semiconductor chip 2 in cross-sectional view.

The semiconductor chip 2 comprises a semiconductor body 26 and an electrically insulating layer 27 on the semiconductor body 26. The side of the electrically insulating layer 27 facing away from the semiconductor body 26 forms an underside 20 of the semiconductor chip 2. The semiconductor body 26 is based on, for example, a nitride compound semiconductor material. The semiconductor body 26 comprises, for example, an active layer for generating or absorbing electromagnetic radiation. The semiconductor chip 2 is in particular an optoelectronic semiconductor chip 2.

The semiconductor chip 2 comprises contact pins 21 which are electrically conductively connected to the semiconductor body 26. The contact pins 21 are made of nickel, for example. Furthermore, the semiconductor chip 2 comprises two positioning pins 25, which are also formed predominantly of nickel, for example. The contact pins 21 and the positioning pins 25 protrude from the underside 20. Thereby, the positioning pins 25 protrude further from the underside than the contact pins 21.

The positioning pins 25, and in this case also the contact pins 21, each narrow in the direction away from the underside 20. The positioning pins 25 each have, for example, the shape of a truncated cone or truncated pyramid. On a side of the positioning pins 25 facing away from the underside 20, these each comprise a cover element 250, for example made of platinum.

In FIG. 1A, a connection carrier 1 is also shown. The connection carrier 1 is, for example, a silicon-based carrier with an integrated circuitry. The connection carrier 1 comprises an upper side 10 in which a contact recess 11 is brought in for each contact pin 21. Furthermore, a positioning recess 15 is brought into the upper side 10 for each positioning pin 25. The positioning recesses 15 are deeper than the contact recesses 11. One of the positioning recesses 15 is cylindrical or cuboid-shaped. The other positioning recess 25 is pyramid-shaped or cone-shaped. An electronic switch 13 is associated with each of the contact recesses 11. The switches 13 are transistors, for example.

Each of the contact recesses 11 is partially filled with a solder material 12. The solder material 12 is AuSn, for example. The solder material 12 is electrically conductively connected to the switches 13. It can be seen that the solder materials 12 from different contact recesses 11 are not interconnected and are electrically isolated from each other. In particular, the areas of the upper side 10 of the connection carrier 1 outside the contact recesses 11 are free of the solder material 12.

Figure 1B:
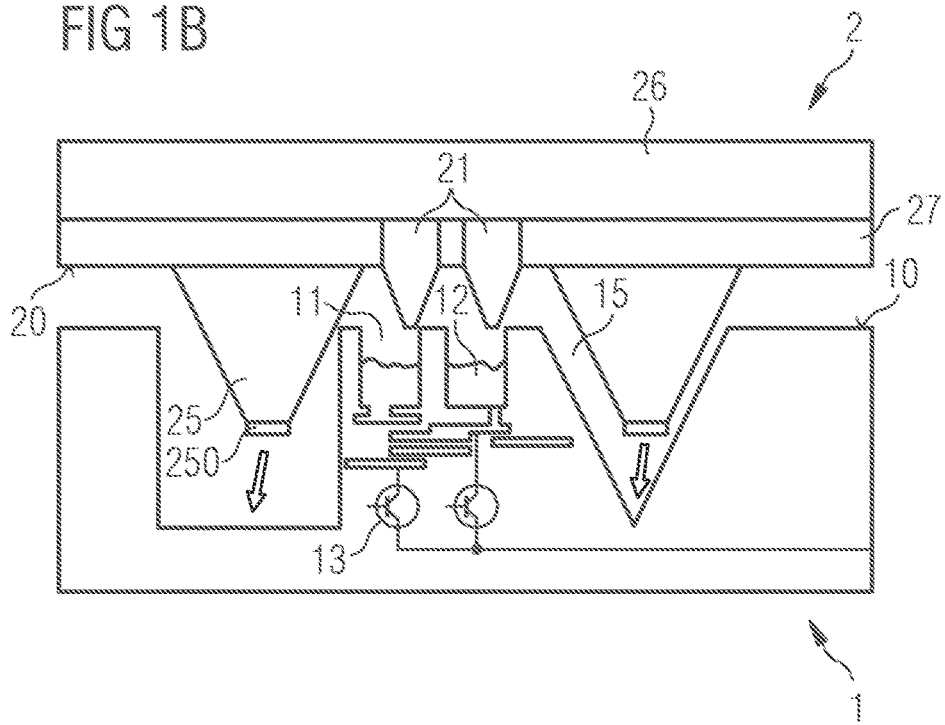

In FIG. 1B, a position in the method is shown in which the semiconductor chip 2 is placed on the upper side 10 of the connection carrier 1 with the contact pins 21 first. Previously, the solder material 12 has been at least partially melted in the contact recesses 11.

During placement, the positioning pins 25 are first inserted into the positioning recesses 15. Due to the narrowing shape of the positioning pins 25, they slide over the edges of the upper side 10 adjacent to the positioning recesses 15 during insertion. This, in turn, causes the semiconductor chip 2 to be automatically laterally displaced and/or rotated and thus adjusted with respect to the connection carrier 1 (see arrows). Subsequently, the contact pins 21 then penetrate into the contact recesses 11 and are thereby wetted by the molten solder material 12.

Figure 1C:
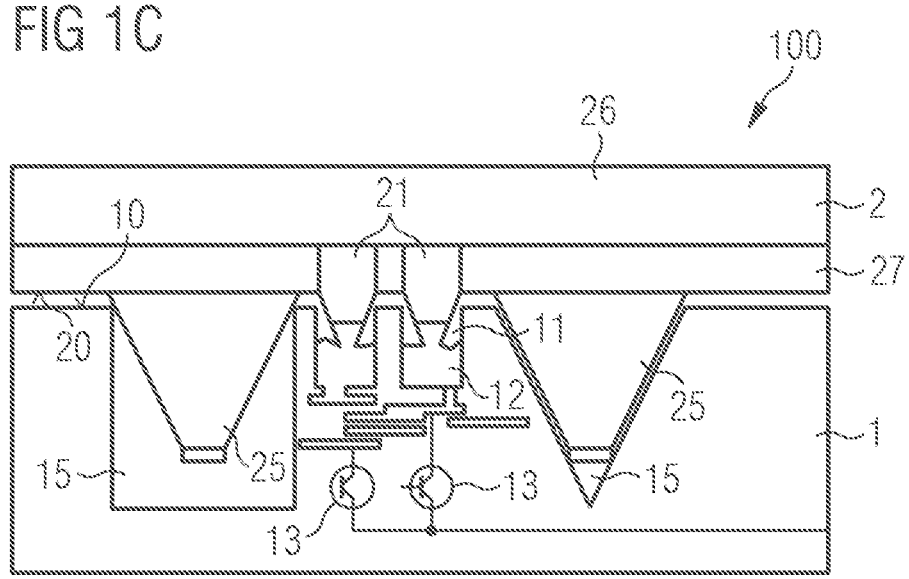

In FIG. 1C, the semiconductor chip 2 is placed on the connection carrier 1 in its final position with respect to the connection carrier 1. Here, for example, the contact pins 21 are cohesively connected to the solder material 12 in the contact recesses 11 by isothermal solidification and are thus electrically conductively connected to the switches 13. FIG. 1C simultaneously shows a completed electronic component 100.

Figure 2A:
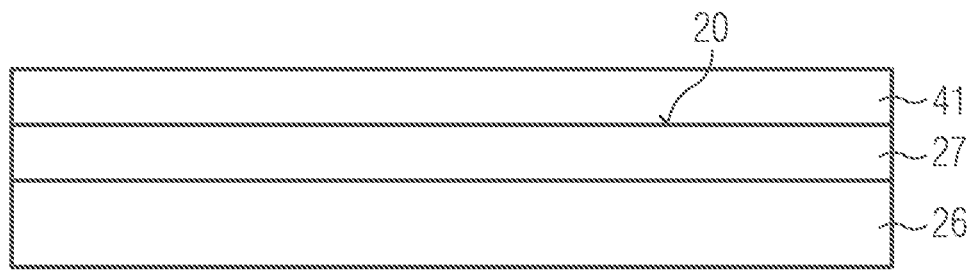
FIGS. 2A-2K and 3 show various positions in an exemplary embodiment of the method for producing a semiconductor chip and an exemplary embodiment of a semiconductor chip.

In FIG. 2A, a first position in an exemplary embodiment for producing a semiconductor chip is shown. The semiconductor chip is, for example, the semiconductor chip of FIGS. 1A to 1C. First, a base body, for example, a wafer composite, is provided. The base body comprises a semiconductor body 26 and an electrically insulating layer 27. The side of the electrically insulating layer 27 opposite to the semiconductor body 26 forms an underside 20 of the base body. A first mask layer 41, for example a photoresist layer, is applied to the underside 20.

Figure 2B:
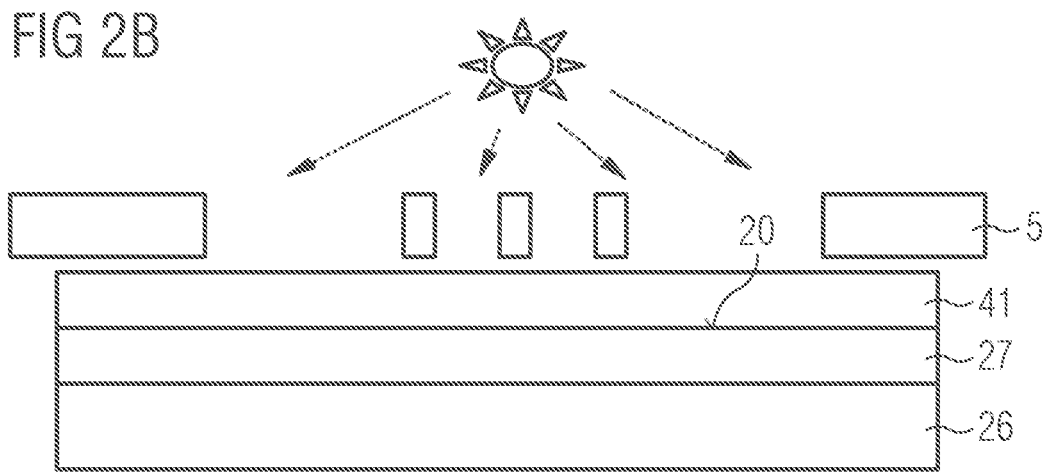

In FIG. 2B, a second position of the method is shown, in which the mask layer 41 is structured with the aid of a mask 5. Present, a photolithography process is used for this purpose. The structuring process brings in holes in the mask layer 41 at the positions where the contact pins and the positioning pins are to be created.

Figure 2C:
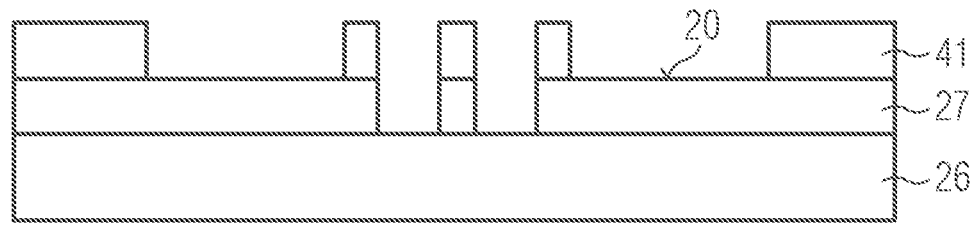

In FIG. 2C, a third position of the method is shown. In the area where the contact pins are to be formed, the electrically insulating layer 27 is additionally provided with holes. For this purpose, for example, another lithography process has been used.

Figure 2D:
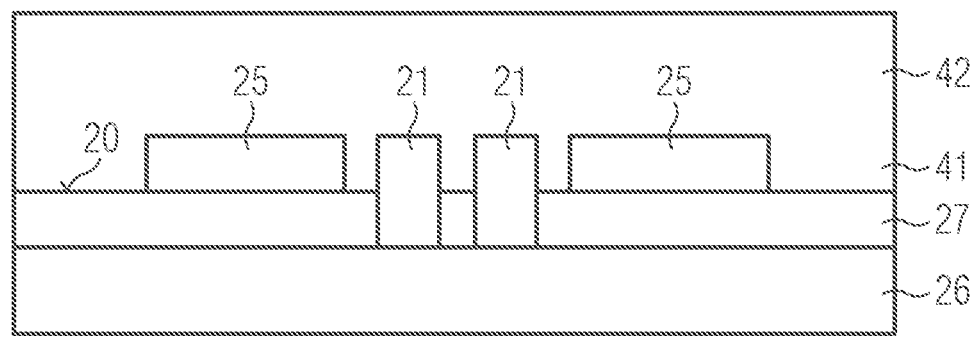

In FIG. 2D, a fourth position of the method is shown in which the contact pins 21 and first portions of the positioning pins 25 are formed in the region of the holes of the first mask layer 41. For example, the contact pins 21 and the first portions of the positioning pins 25 are deposited via a common first electroplating process. The heights of the contact pins 21 and the first portions of the positioning pins 25, measured perpendicular to the underside 20, are the same within the manufacturing tolerance. The contact pins 21 are electrically conductively connected to the semiconductor body 26.

Furthermore, it can be seen in FIG. 2D that a second mask layer 41 is applied to and covers the first portions of the positioning pins 25 and the contact pins 21.

Figure 2E:
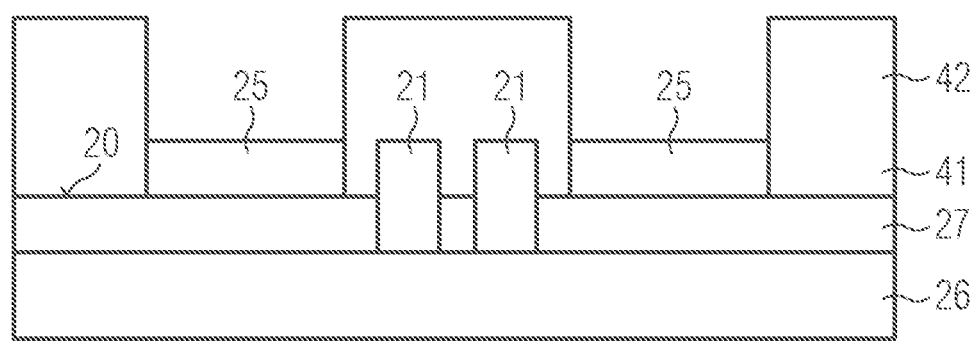

In FIG. 2E, a fifth position of the method is shown in which the second mask layer 42 is patterned, for example again using a lithography method. Here, the first portions of the positioning pins 25 are exposed. The contact pins 21 are further covered by the second mask layer 42.

Figure 2F:
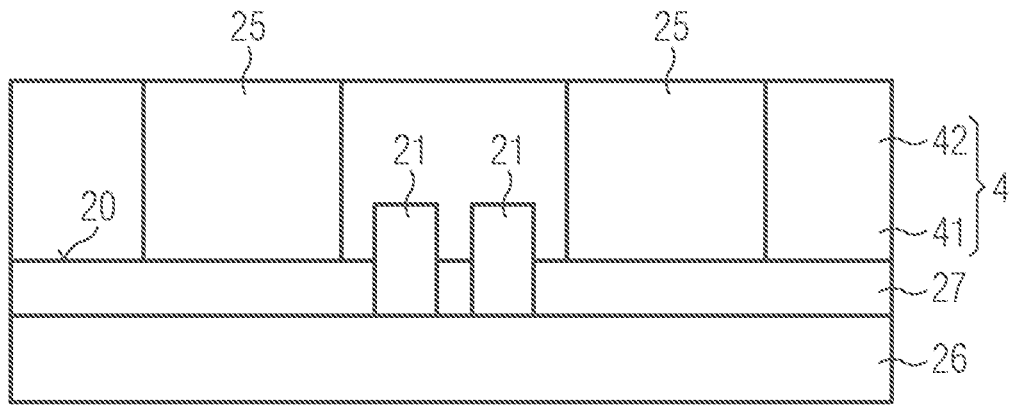

In FIG. 2F, a sixth position of the method is shown, in which, for example, by means of a second electroplating process, the positioning pins 25 have been completed. Here, the heights of the positioning pins 25 have been increased so that the positioning pins 25 now protrude further from the underside 20 than the contact pins 21.

The first mask layer 41 and the second mask layer 42 together now form a shaped body 4 which laterally encompasses the positioning pins 25. The positioning pins 25 have a substantially constant diameter throughout their height.

Figure 2G:
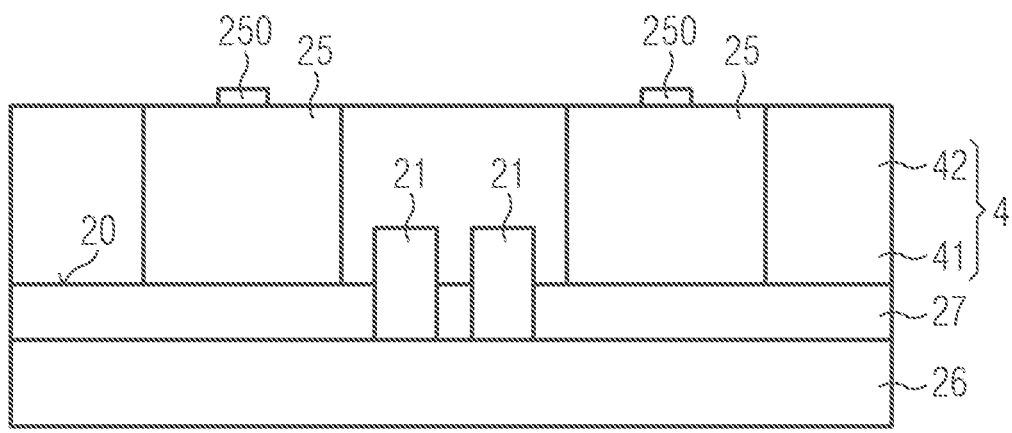

In a seventh position of the method, shown in FIG. 2G, a cover element 250, for example of platinum, is applied to each of the sides of the positioning pins 25 facing away from the semiconductor body 26. The cover elements 250 each comprise a smaller diameter than the positioning pins 25.

Figure 2H:
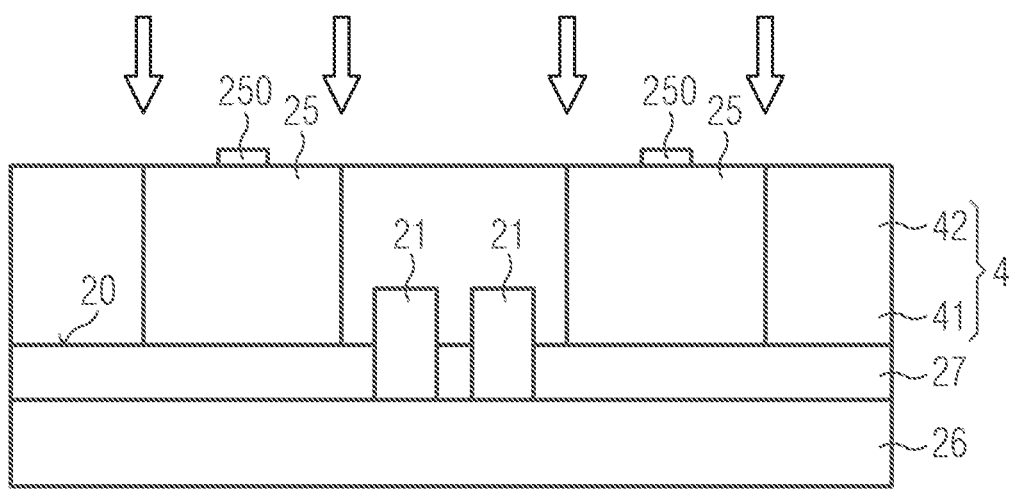

In FIG. 2H, an eighth position in the method is shown, in which an etching process is carried out. In this process, an etchant is applied to the sides of the positioning pins 25 and the shaped body 4 facing away from the semiconductor body 26.

Figure 2I:
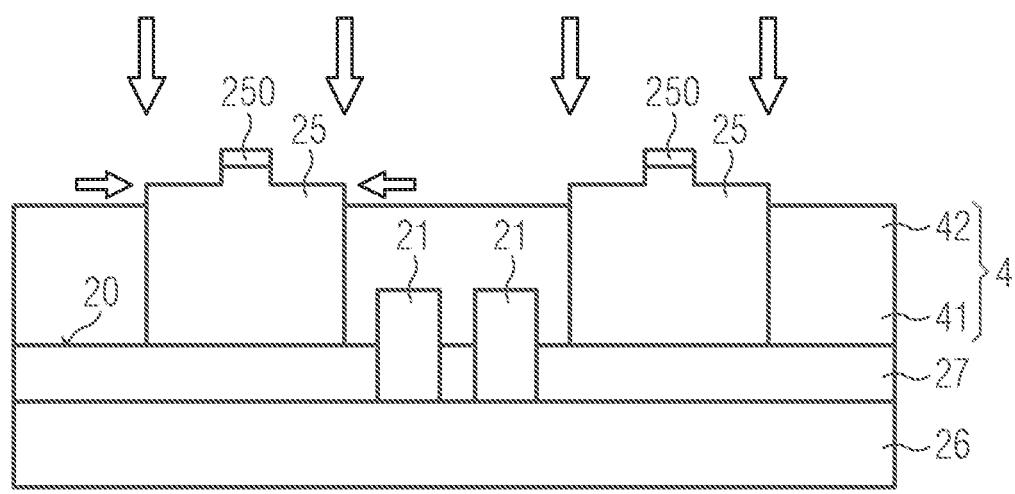

In FIG. 2I, a ninth position is shown after the etchant has acted on the positioning pins 25 and the shaped body 4 for a certain time. The etchant is selected to etch the shaped body 4 more strongly than the positioning pins 25. The cover element 250 is selected so that it is not attacked by the etchant. Because the etchant attacks the shaped body 4 more strongly than the positioning pins 25, side surfaces of the positioning pins 25 are partially exposed. The etchant then also acts on these side surfaces.

Figure 2J:
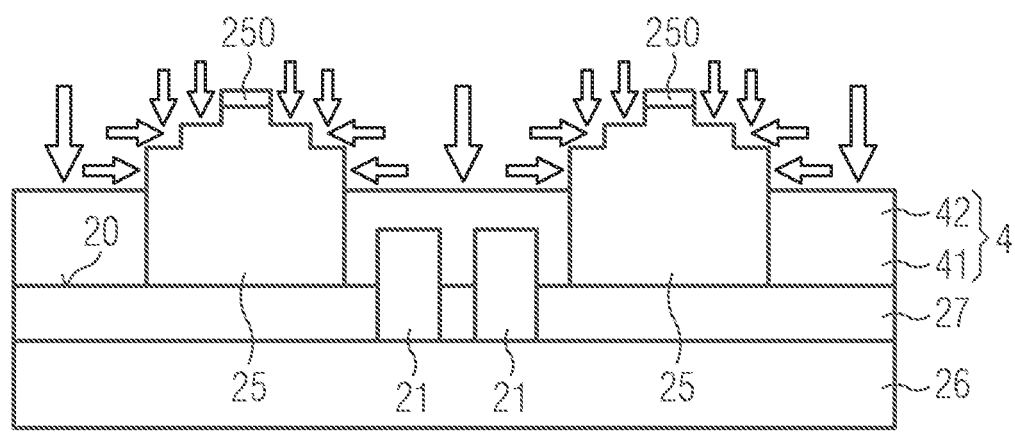

In FIG. 2J, a tenth position is shown after the etchant has acted for a little longer.

Figure 2K:
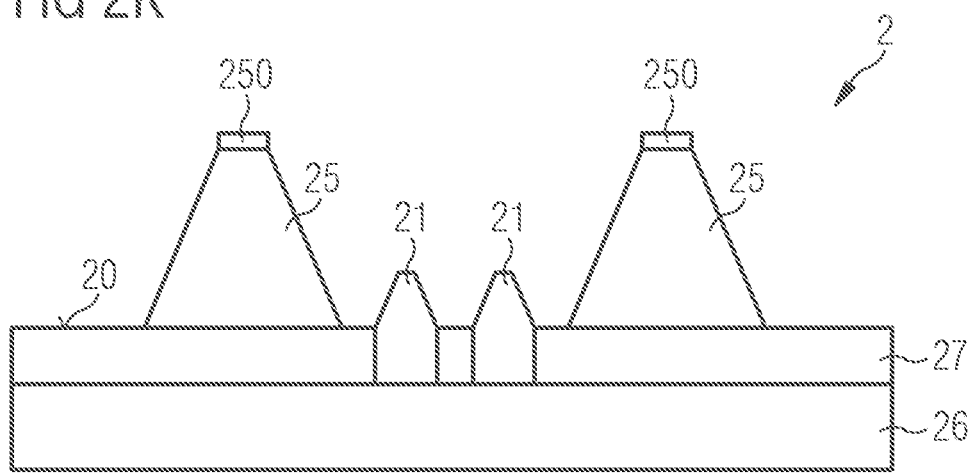

In FIG. 2K, an eleventh position is shown after the etchant has acted for an even longer time. The etchant has completely dissolved the shaped body 4. Due to the different etching rates, the positioning pins 25 now each comprise a diameter that decreases in the direction away from the underside 20. The same applies to the contact pins 21, which were also partially encompassed laterally from the shaped body 4. FIG. 2J also shows a finished semiconductor chip 2. The base body was previously separated.

Figure 3:
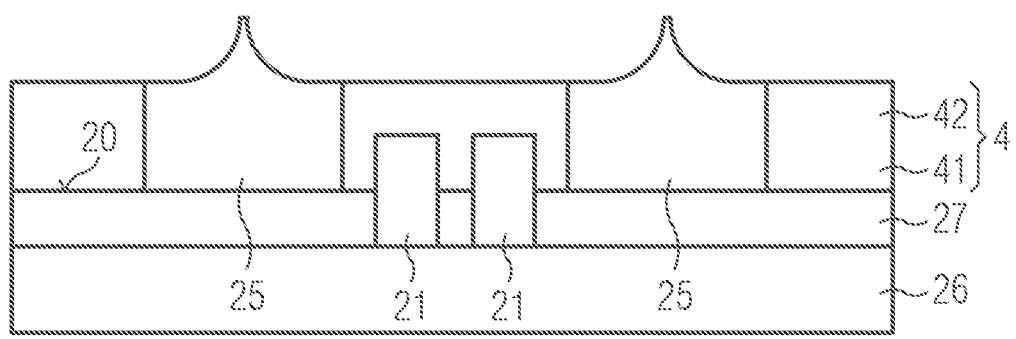

FIG. 3 shows a position in the method which corresponds essentially to the position of FIG. 2J. Here, however, the etching rate of the etchant for the shaped body 4 is not substantially greater than for the positioning pins 25, so that nearly needle-shaped positioning pins 25 are formed.

The invention is not limited to the exemplary embodiments by the description thereof. Rather, the invention comprises any new feature as well as any combination of features, which in particular includes any combination of features in the patent claims, even if these features or this combination itself is not explicitly specified in the patent claims or exemplary embodiments.

The invention claimed is:

1. A method for producing an electronic component, the method comprising:
   providing a semiconductor chip comprising a plurality of contact pins, at least one positioning pin and an underside,
   wherein the contact pins and the positioning pin protrude from the underside, respectively,
   wherein the contact pins are configured for making electrical contact with the semiconductor chip,
   wherein the positioning pin narrows in a direction away from the underside, and
   wherein the positioning pin protrudes further from the underside than the contact pins;
   providing a connection carrier comprising a plurality of contact recesses, at least one positioning recess and an upper side,
   wherein each contact recess is at least partially filled with a solder material;
   heating the solder material in the contact recesses to a joining temperature at which the solder material at least partially melts; and
   placing the semiconductor chip on the connection carrier,
   wherein each contact pin is inserted into a contact recess and the positioning pin is inserted into the positioning recess, and
   wherein the contact pins are immersed in the molten solder material.

2. The method according to claim 1,
   wherein the positioning recess comprises a larger diameter than the positioning pin,
   wherein a diameter of the positioning recess is at most twice as large as a diameter of the positioning pin at a widest point, and
   wherein a depth of the positioning recess is greater than depths of the contact recesses.

3. The method according to claim 1, wherein the solder material and a material of the contact pins are selected such that the solder material and the contact pins are joined together by isothermal solidification at the joining temperature.

4. The method according to claim 1, wherein the method connects the semiconductor chip on the connection carrier.

5. The method according to claim 1,
   wherein the semiconductor chip is a pixelated optoelectronic semiconductor chip, and
   wherein one or more pixels of the pixelated semiconductor chip are assigned to each contact pin.

6. The method according to claim 1,
   wherein the connection carrier comprises a plurality of electronic switches, and
   wherein a switch is associated with each contact recess.

7. The method according to claim 1, wherein the contact pins are immersed in the molten solder material such that in each contact recess a volume of the displaced solder material is at least 10% of a total volume of the solder material in the contact recess.

8. The method according to claim 1, wherein the upper side of the connection carrier in a region outside the contact recesses and the positioning recess is less wettable with the molten solder material than the contact pins.

9. The method according to claim 1, wherein each positioning pin comprises a cover element on a side of the positioning pin facing away from the underside.

10. The method according to claim 9, wherein the cover element is made of platinum.

11. An electronic component comprising:
    a semiconductor chip comprising a semiconductor body, an underside, a plurality of contact pins and at least one positioning pin; and
    a connection carrier having an upper side comprising a plurality of contact recesses and at least one positioning recess,
    wherein each of the contact pins and the positioning pin protrudes from the underside,
    wherein the contact pins are configured for making electrical contact with the semiconductor body,
    wherein the positioning pin narrows in a direction away from the underside,
    wherein the positioning pin protrudes further from the underside than the contact pins,
    wherein each contact recess is at least partially filled with a solder material,
    wherein the solder material of different contact recesses is not contiguous,
    wherein the semiconductor chip is mounted on the upper side of the connection carrier with the underside first,
    wherein a contact recess is assigned to each contact pin and the positioning recess is assigned to the positioning pin,
    wherein each contact pin protrudes into a contact recess,
    wherein the positioning pin protrudes into the positioning recess, and
    wherein each contact pin is bonded cohesively to the solder material of the contact recesses.

12. The electronic component according to claim 11, wherein the positioning pin is electrically insulated from the semiconductor body.

13. The electronic component according to claim 11, wherein the semiconductor chip is electrically connected to the connection carrier via the contact pins and the solder material.

14. The electronic component according to claim 11, wherein each positioning pin comprises a cover element on a side of the positioning pin facing away from the underside.

15. The electronic component according to claim 14, wherein the cover element is made of platinum.

16. A method for producing a semiconductor chip, the method comprising:
    providing a base body comprising a semiconductor body and an underside, wherein a plurality of contact pins and at least one positioning pin, each of which protrudes from the underside, are arranged on the semiconductor body, wherein the contact pins are configured for making electrical contact with the semiconductor body, wherein the positioning pin protrudes further from the underside than the contact pins, and wherein a diameter of the positioning pin is substantially constant over an entire height of the positioning pin;

forming a shaped body on the semiconductor body in a region adjacent to the positioning pin, wherein the shaped body laterally encompasses the positioning pin; and performing an etching process by applying an etchant to sides of the shaped body and of the positioning pin facing away from the semiconductor body, wherein the etchant etches the shaped body and the positioning pin, wherein the etchant comprises a higher etching rate for the shaped body than for the positioning pin, and wherein the etching process is performed until a shape of the positioning pin has changed such that the positioning pin narrows in a direction away from the underside.

17. The method according to claim 16, wherein the etching process is performed until the shaped body is completely removed.

18. The method according to claim 16, wherein the contact pins and the positioning pin are electroplated on the semiconductor body before providing the base body.

19. The method according to claim 18, wherein the contact pins and a first portion of the positioning pin are produced together by a first electroplating process, and wherein the positioning pin is subsequently finished by a second electroplating process.

* * * * *